(12) United States Patent
Goldstein et al.

(10) Patent No.: US 8,102,671 B2
(45) Date of Patent: Jan. 24, 2012

(54) SERIAL CONNECTION EXTERNAL INTERFACE RISER CARDS AVOIDANCE OF ABUTMENT OF PARALLEL CONNECTION EXTERNAL INTERFACE MEMORY MODULES

(75) Inventors: Martin Goldstein, Campbell, CA (US); Hau Jiun Chen, Singapore (SG); Mun Hoong Tai, Singapore (SG); Choon Pheng Tan, Singapore (SG)

(73) Assignee: Hewlett-Packard Development Company, L.P., Houston, TX (US)

( * ) Notice: Subject to any disclaimer, the term of this patent is extended or adjusted under 35 U.S.C. 154(b) by 1013 days.

(21) Appl. No.: 11/789,632

(22) Filed: Apr. 25, 2007

(65) Prior Publication Data

US 2008/0266777 A1 Oct. 30, 2008

(51) Int. Cl.
*H05K 1/11* (2006.01)
*H05K 1/14* (2006.01)
(52) U.S. Cl. ......... 361/803; 361/761; 361/782; 361/784
(58) Field of Classification Search .................. 361/803, 361/760–764, 782–784; 365/63, 65
See application file for complete search history.

(56) References Cited

U.S. PATENT DOCUMENTS

| | | | |
|---|---|---|---|
| 5,396,102 A * | 3/1995 | Toshio et al. ................ | 257/723 |
| 5,440,755 A | 8/1995 | Harwer et al. | |
| 5,901,070 A | 5/1999 | Trainor | |
| 5,935,252 A | 8/1999 | Berglund et al. | |
| 6,215,727 B1 | 4/2001 | Parson et al. | |
| 6,347,367 B1 | 2/2002 | Dell et al. | |
| 6,363,450 B1 | 3/2002 | Lash et al. | |
| 6,392,946 B1 | 5/2002 | Wu et al. | |
| 6,467,048 B1 | 10/2002 | Olarig et al. | |
| 6,507,888 B2 | 1/2003 | Wu et al. | |
| 6,779,075 B2 | 8/2004 | Wu et al. | |
| 6,826,113 B2 | 11/2004 | Ellis et al. | |
| 7,143,298 B2 | 11/2006 | Wells et al. | |
| 7,280,373 B2 * | 10/2007 | Aizawa ......................... | 361/803 |
| 7,292,950 B1 | 11/2007 | Resnick | |
| 7,379,316 B2 | 5/2008 | Rajan | |
| 7,475,316 B2 | 1/2009 | Cowell et al. | |
| 7,532,537 B2 | 5/2009 | Solomon et al. | |
| 7,539,810 B2 | 5/2009 | Gower et al. | |
| 7,577,039 B2 | 8/2009 | Yang et al. | |
| 2004/0163002 A1 | 8/2004 | Doblar et al. | |
| 2006/0047899 A1 | 3/2006 | Ilda et al. | |
| 2006/0146629 A1 | 7/2006 | Lee | |
| 2006/0155517 A1 | 7/2006 | Dobbs et al. | |
| 2006/0236134 A1 | 10/2006 | Kamepalli et al. | |
| 2007/0192563 A1 | 8/2007 | Rajan et al. | |

(Continued)

OTHER PUBLICATIONS

*JEDEC STANDATD, FBDIMM: Architecture and Protocol, JESD206.PDF* © JEDEC Solid State Technology Association, Arlington, Virginia http://www.jedec.org/download/search/JESD206.pdf Section 2.1.3 (AMB addressing) table 2-4 showing the DS [3:0] usage.

(Continued)

*Primary Examiner* — Tuan T Dinh

(57) ABSTRACT

A first riser card of an apparatus in an example substantially axially connects with a first serial connection external interface of a printed circuit board (PCB) and at least in part laterally connects with a parallel connection external interface of a first memory module. The first riser card supports the first memory module with avoidance of abutment of the first memory module with a second memory module supported by a second riser card that is adjacent to the first riser card.

15 Claims, 12 Drawing Sheets

U.S. PATENT DOCUMENTS

| | | |
|---|---|---|
| 2007/0239906 A1 | 10/2007 | Vakil et al. |
| 2008/0052462 A1 | 2/2008 | Blakely et al. |
| 2008/0059816 A1 | 3/2008 | Paniagua et al. |
| 2008/0077731 A1 | 3/2008 | Forrest et al. |
| 2008/0091888 A1 | 4/2008 | Sandy |
| 2008/0126690 A1 | 5/2008 | Rajan et al. |
| 2008/0181021 A1 | 7/2008 | Thayer |
| 2008/0250292 A1 | 10/2008 | Djordjevic |
| 2008/0256281 A1 | 10/2008 | Fahr et al. |
| 2009/0020608 A1 | 1/2009 | Bennett et al. |
| 2009/0101711 A1 | 4/2009 | Grayson |

OTHER PUBLICATIONS

Same Document Section 2.1.3 paragraph 3 shows that for DRAM addressing one can only use DS [2:0].

Same Document Section 4.2.3 find the FBD command encoding protocol. This is the same protocol that would be used by disclosure 63, this table also shows the RS (rank selection bit).

Same Document Section 4.2.4 find information on DRAM commands and a DRAM comman mapping example—this section (paragraph 3) explains the use of the RS bit according to the FBD spec.

Same Document Section 4.4.2 gives a write timing example and describes the use of write FIFOs by the AMB.

Same Document Section 4.4.2.1 describes the use of the WS bits according to the FBD protocol.

Torres, Gabriel "How FB-DIMM Memories Work", http://www.hardwaresecrets.com/article/266.

Torres, Gabriel "How FB-DIMM Memories Work", http://www.hardwaresecrets.com/article/266, published Dec. 23, 2005.

* cited by examiner

SERIAL CONNECTION EXTERNAL INTERFACE RISER CARDS AVOIDANCE OF ABUTMENT OF PARALLEL CONNECTION EXTERNAL INTERFACE MEMORY MODULES

BACKGROUND

DIMM (dual in-line memory module) technology has random access memory (RAM) integrated circuits (ICs) mounted on a printed circuit board (PCB). Various types of DIMMs exist. DDR SDRAM (Double Data Rate Synchronous Dynamic Random Access Memory) DIMM technology has a parallel external interface. Fully buffered DIMM or FB-DIMM technology has a serial external interface.

FB-DIMM technology employs an Advanced Memory Buffer (AMB) having a serial connection to a memory controller, and a parallel connection to dynamic random access memory (DRAM). The AMB on each FB-DIMM translates the communication in serial point-to-point link protocol received from the memory host controller to DDR3 SDRAM parallel protocol transmitted to the DRAMs as read, write, refresh, etc. operations within the DIMM.

The PCB and FB-DIMM are coupled by connectors. The connectors are serial connection external interfaces. The standard pitch and/or center-to-center spacing of the connectors is approximately 0.5 in (12.7 mm) or more.

DESCRIPTION OF THE DRAWINGS

Features of exemplary implementations of the invention will become apparent from the description, the claims, and the accompanying drawings in which:

DETAILED DESCRIPTION

Figure 1:
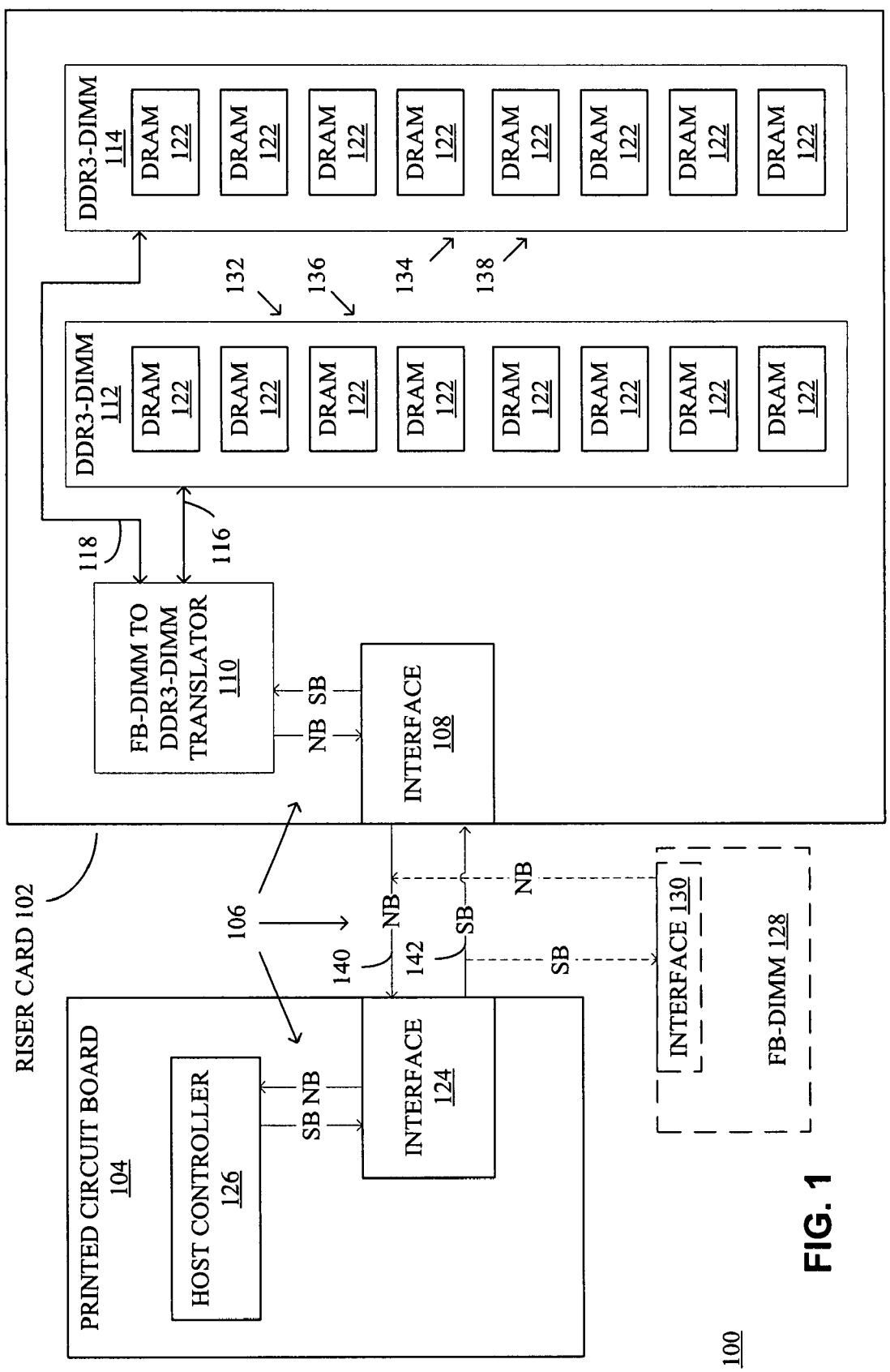
FIG. 1 is a representation of an implementation of an apparatus that comprises one or more riser boards and/or cards, a system board and/or printed circuit board (PCB), one or more serial protocol busses, one or more parallel protocol memory modules, and one or more parallel protocol busses.

Referring to the BACKGROUND section above, while the FB-DIMM has internal memory with parallel connections, the external interface is a serial connection. With DDR3 SDRAM being a successor to DDR2 SDRAM in DDR memory standards, computer system boards with FB-DIMM connectors embedded will not be able to support DDR3 SDRAM DIMMs. The serial memory connections of FB-DIMM connectors are fundamentally different from the parallel memory connections of DDR3 DRAM DIMM connectors.

FB-DIMMs are based on serial data transfer technology while DDR3 SDRAM DIMMs are based on parallel data transfer technology. An exemplary implementation allows both different memory technologies to be used in a same package with no additional cost added to the design of a computer system board with existing FB-DIMM connectors. The cost of supporting both memory technologies on a single platform in an example is moved to a translator riser board and/or card. An exemplary translator riser card comprises an FB-DIMM-to-DDR3 SDRAM translator IC and DDR3 SDRAM DIMM connectors. Full memory speed for both FB-DIMMs and DDR3 SDRAM DIMMs in an example is achievable.

An exemplary implementation supports DDR3 SDRAM DIMMs on systems with embedded FB-DIMM connectors without need for additional hardware to be designed into the system board. An exemplary approach reduces modification time, labor, and/or materials through employment of a single memory technology such as FB-DIMM on the computer system board while at the same time increasing memory capacity of both FB-DIMM and DDR3 SDRAM. A translator in an example serves to communicatively interconnect FB-DIMM and DDR3 SDRAM. An exemplary translator comprises a translator riser board and/or card. The riser card in an example comprises a circuit card or board that connects directly to the PCB and allows addition of cards to the PCB by connection through the riser card.

An exemplary implementation provides low cost for DDR3 SDRAM support on FB-DIMM connectors through employment of a translator riser card. An exemplary approach provides low cost employment of two different types of memory technology, for example, DDR3 SDRAM DIMMs and FB-DIMMs on a single platform with existing FB-DIMM connector, for example, through employment of a translator riser card. An exemplary translator riser card comprises an FB-DIMM-to-DDR3 SDRAM translator and DDR3 DIMM connectors. For example, the translator comprises an IC and/or chip. The translator riser card in an example plugs in vertically and/or orthogonally to FB-DIMM connectors and allows DDR3 DIMMs to run directly from the FB-DIMM connectors. An exemplary implementation reduces modification cost by allowing a single memory technology, for example, FB-DIMM, on the computer system board and/or PCB and contemporaneously promoting memory capacity of DDR3 SDRAM FB-DIMM, for example, through employment of the translator riser card.

An exemplary riser card plugs directly into a system board with an FB-DIMM connector and allows DDR3 DIMMs on computer systems designed for FB-DIMM memory technology. With a translator riser card in an example no additional investment is required to allow DDR3 memory technology on system boards designed for FB-DIMM memory technology.

An exemplary implementation provides low cost for delivery of DDR3 SDRAM and FB-DIMM memory architecture on a computer system with standard FB-DIMM socket pitch. The standard pitch and/or center-to-center spacing of FB-DIMM connectors on a PCB is approximately 0.5 in (12.7 mm) or more. An exemplary employment of pairs, for example, alternating and/or staggered pairs and/or sets, of translator riser cards allows use of DDR3 SDRAM DIMMs on PCBs with FB-DIMM connectors with standard connector pitch.

An exemplary implementation allows DDR3 SDRAM DIMMs to run at full speed and with full available bandwidth on a PCB and/or computer system designed for FB-DIMM memory architecture. This remains true for systems with standard FB-DIMM connector pitch. An exemplary approach provides a user an option of using either FB-DIMM or DDR3 SDRAM DIMMs on a PCB and/or computer system with FB-DIMM connectors.

An exemplary approach removes from the PCB an otherwise additional cost of designing into the PCB memory architectures of both FB-DIMM and DDR3 SDRAM DIMM. An exemplary approach simplifies a design of the PCB and/or computer system so the designer needs to design for only FB-DIMM memory architecture. An exemplary approach moves the added cost and complexity for DDR3 SDRAM DIMM memory architecture to pairs and/or sets of translator riser cards. The translator riser cards in an example fit into a PCB embedded with FB-DIMM connectors, for example, designed to JEDEC (JEDEC Solid State Technology Association, previously known as the Joint Electron Device Engineering Council; World Wide Web jedec.org) specification and with standard connector pitch, for example, 0.5 in (12.7 mm) or wider. Another exemplary implementation fits and/or inserts the pairs and/or sets of translator riser cards into FB-DIMM connectors where the pitch is less than 0.5 in (12.7 mm).

An exemplary implementation reduces and/or minimizes space required, used, and/or needed on the PCB to support both FB-DIMM and DDR3 SDRAM DIMM. An exemplary approach reduces cost of the PCB by avoiding need for additional space on the board to support both FB-DIMM and DDR3 SDRAM DIMM. An example implementation allows shipment of PCBs and/or computer systems embedded with FB-DIMM connectors and yet able to support DDR3 SDRAM DIMMs without changing the PCB and/or system board. An exemplary approach lowers the cost of the computer system by needing only one memory architecture, for example, FB-DIMM to be designed into the PCB. An exemplary approach reduces the cost by shipping the computer system with support for only FB-DIMM, for example, shipping without the translator riser card. An exemplary implementation maintains memory bandwidth on both FB-DIMM memory architecture and DDR3 SDRAM DIMM memory architecture such as with two DDR3 SDRAM DIMMs per FB-DIMM bus. An exemplary implementation employs pairs of translator riser cards in alternating and/or staggered FB-DIMM connectors on a PCB. An exemplary approach allows use of DDR3 SDRAM DIMMs on a computer system with standard FB-DIMM connector pitch on the PCB.

An exemplary translator riser card in a pair of translator riser cards comprises a translator and/or bridge IC and/or chip such as an FB-DIMM to DDR3 SDRAM bridge and one or more DDR3 busses and DDR3 SDRAM DIMM connectors. In an exemplary implementation, one edge of each translator riser card comprises gold fingers that fit into a JEDEC standard two hundred forty (240) positions FB-DIMM connector on the PCB.

In an exemplary implementation, a total number of DDR DIMM connectors on the riser card outside the PCB can be the same as a total number of FBDIMM connectors on the PCB. An exemplary approach allows a user to choose between serial and parallel memory technologies without loss in a total quantity of DDR DIMM modules and FBDIMM modules allowable in the system regardless of the memory technology the user and/or customer chooses to use.

Turning to FIG. 1, an implementation of an apparatus 100 in an example comprises one or more riser boards and/or cards 102, 302 (FIG. 3), a system board and/or printed circuit board (PCB) 104, one or more serial protocol busses 106, one or more and/or a plurality of parallel protocol memory modules 112, 114, and one or more parallel protocol busses 116, 118. The serial protocol bus 106 in an example comprises a high speed serial bus. Exemplary implementations of the serial protocol bus 106 comprise industry standard high speed serial busses such as FBD (fully buffered DIMM; FB-DIMM).

Figure 4:
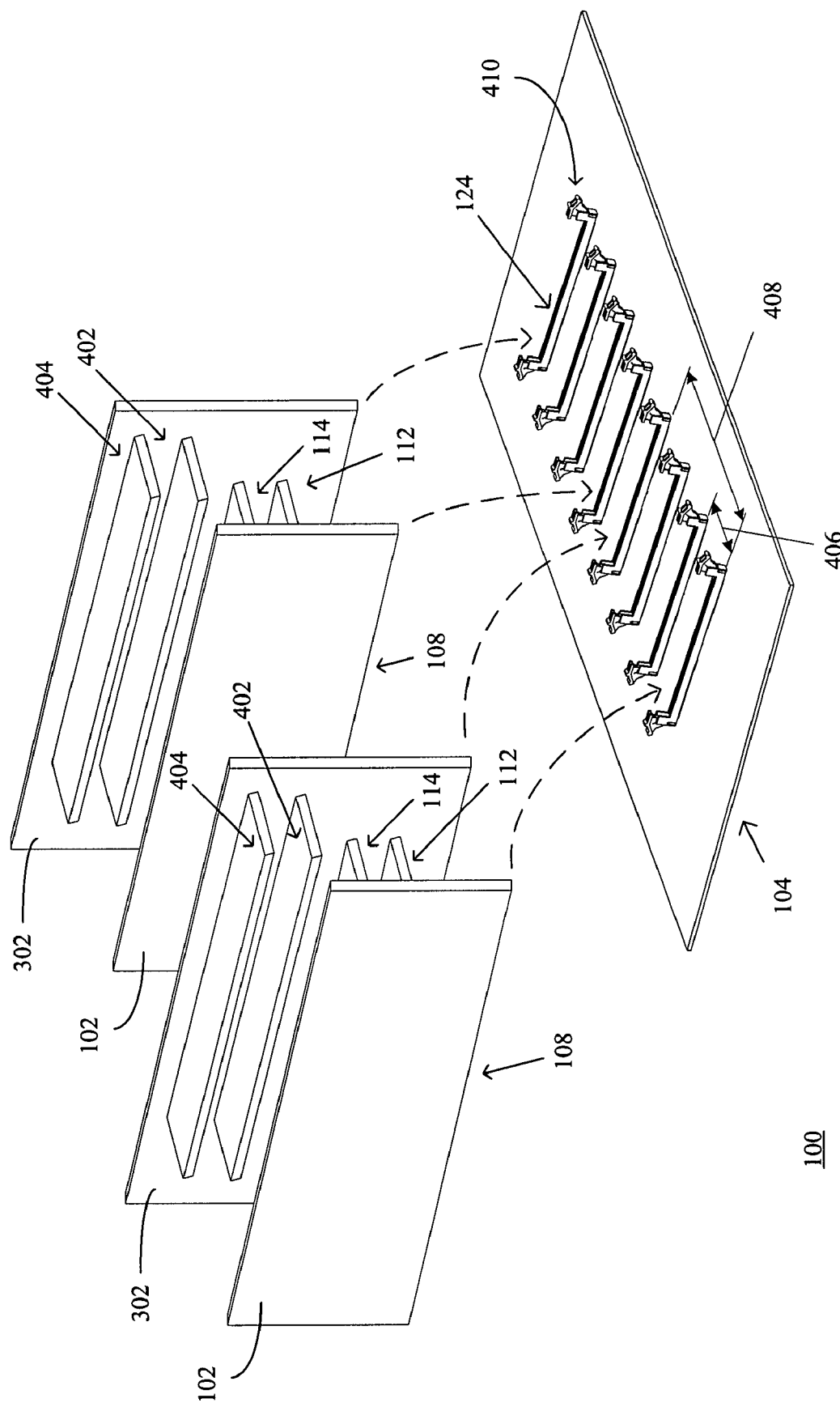
FIG. 4 is a perspective, cutaway, partial, exploded representation of a plurality of riser cards, a plurality of parallel protocol memory modules, and the PCB of an implementation of the apparatus of FIG. 1, and illustrates a first exemplary arrangement of the riser cards and parallel protocol memory modules.
Figure 5:
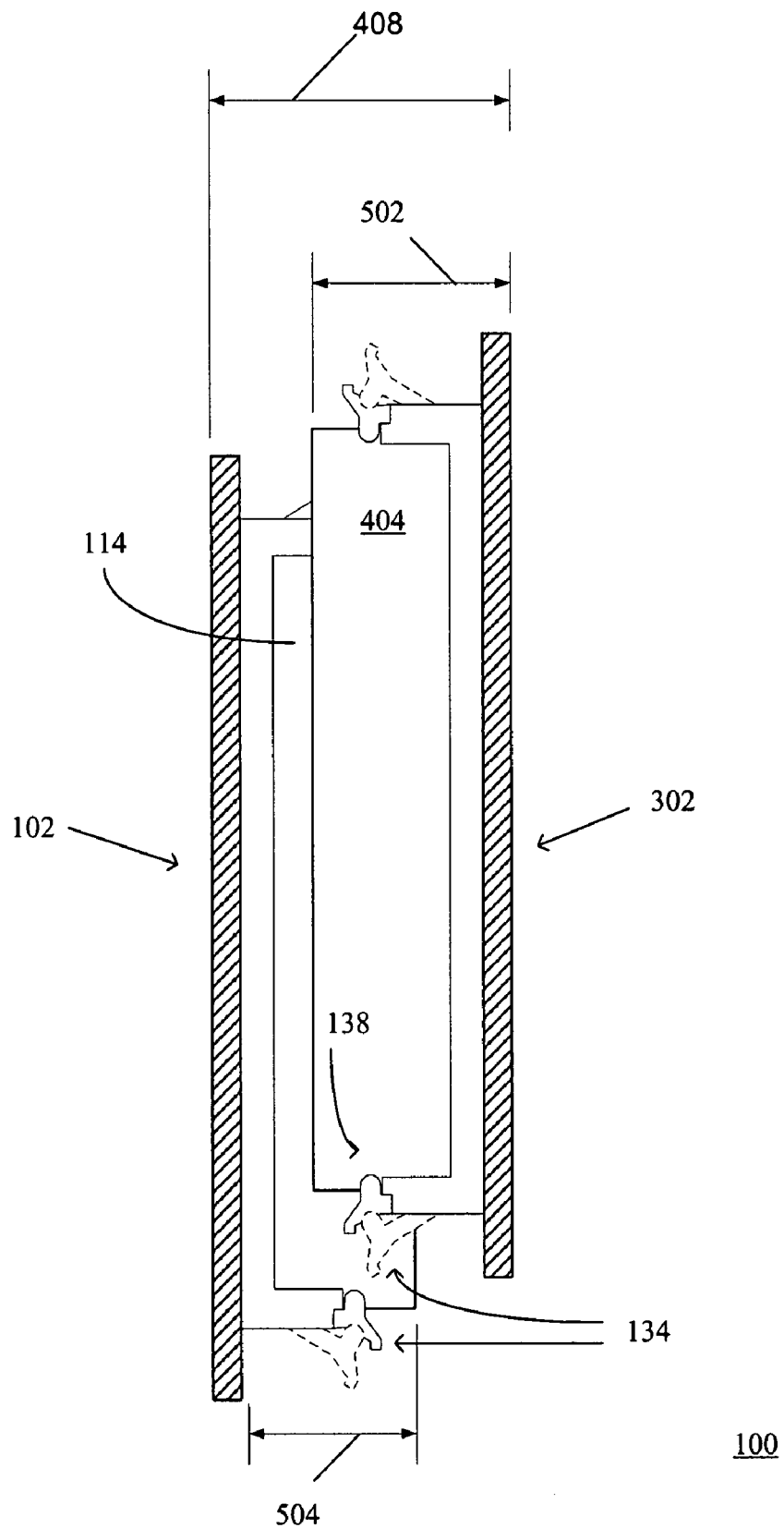
FIG. 5 is a top, partial, perspective representation of two riser cards and two parallel protocol memory modules of the implementation of the apparatus of FIG. 4.
Figure 6:
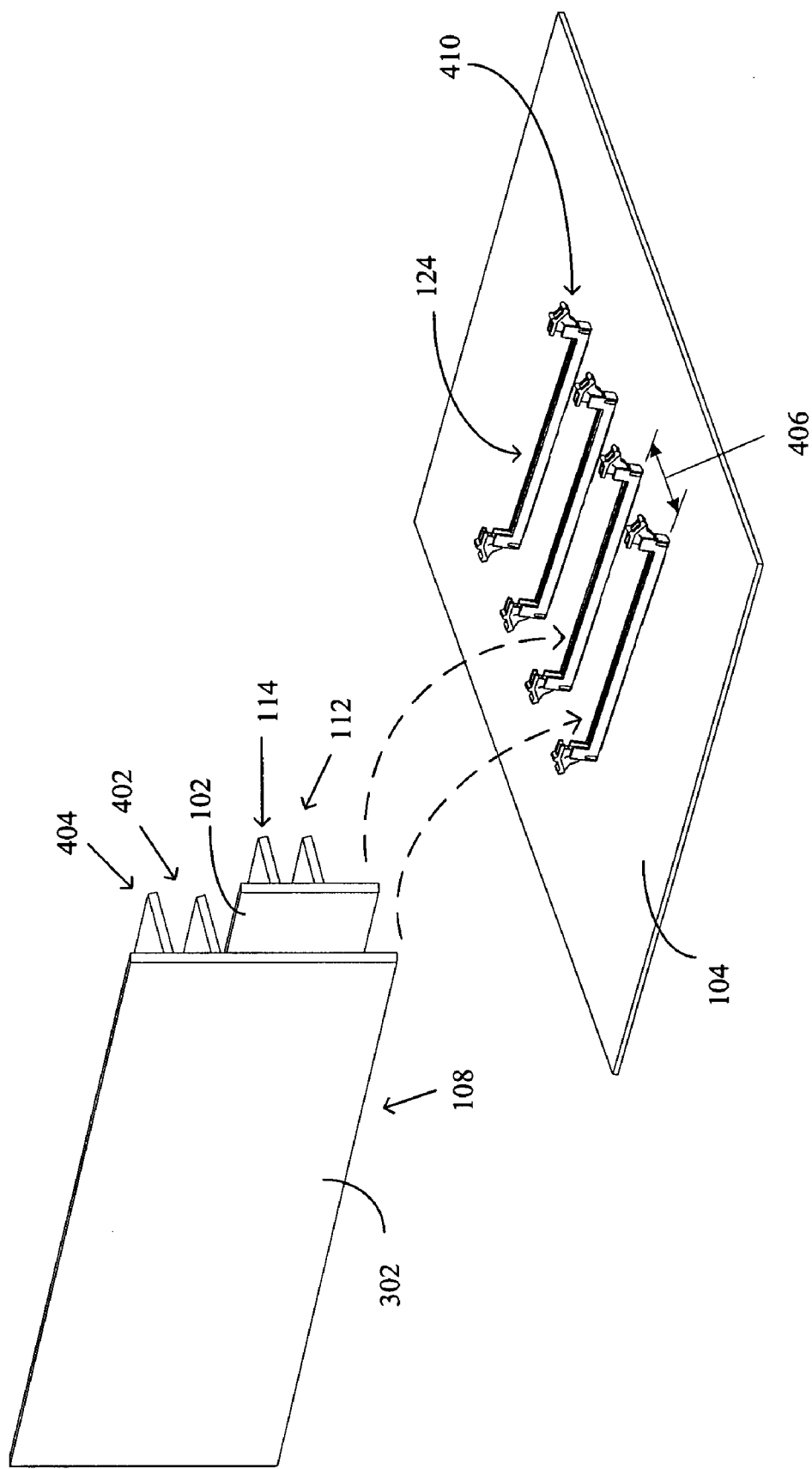
FIG. 6 is similar to FIG. 4 and illustrates a second exemplary arrangement of the riser cards and parallel protocol memory modules.

The riser card 102 in an example comprises a serial protocol interface 108, a translator 110, and one or more parallel protocol connectors and/or interfaces 132, 134 (FIGS. 1 and 5). As discussed herein with reference to FIG. 2, the riser card 102 in an example optionally comprises a connector 202 and/or one or more voltage regulator modules 204. The parallel protocol memory modules 112, 114 in an example comprise respective parallel protocol connectors and/or interfaces 136, 138 (FIGS. 1 and 5) and a plurality of parallel memory devices 122. Exemplary numbers of instances of the parallel protocol memory modules 112, 114 on an exemplary riser card 102 comprise any selected and/or desirable number, for example, two, four, eight, or sixteen parallel protocol memory modules 112, 114, 402 (FIG. 4), 404 (FIG. 4). For explanatory purposes, FIGS. 1-11 illustrate an exemplary implementation that comprises two parallel protocol memory modules 112, 114, 402 (FIG. 4), 404 (FIG. 4) on each riser card 102. As will be appreciated by those skilled in the art, an exemplary riser card 102 comprises more than two parallel protocol memory modules 112, 114, 402 (FIG. 4), 404 (FIG. 4). Exemplary parallel protocol memory modules 112, 114 comprise registered and/or unbuffered DIMMs, for example DDR3 DIMMs. An exemplary parallel memory device 122 comprises a dynamic random access memory (DRAM). The riser card 102 and the parallel protocol memory modules 112, 114 in an example serve to take a place of, substitute for, and/or provide an upgrade from a serial protocol memory module 128 that comprises interface 130 such as a fully buffered dual in-line memory module (FB-DIMM, FBDIMM, and/or FBD).

The PCB 104 in an example comprises a serial protocol interface 124 and a memory controller and/or host controller 126. The serial protocol interfaces 108, 124, 130 in an example comprise FB-DIMM memory module connectors (FB-DIMM connectors). An exemplary FB-DIMM memory module connector as the serial protocol interface 108, 130 in an example comprises two hundred forty (240) pins and/or fingers that comply with standards of the JEDEC Solid State Technology Association (previously known as the Joint Electron Device Engineering Council; World Wide Web jedec.org).

The pins of an exemplary interface 108 are vertical and/or orthogonal. The pins of another exemplary interface 108 are angled and/or oblique. The serial protocol interface 108 in an example comprises gold pins that fit directly into an FB-DIMM memory module connector and/or FB-DIMM connector as the serial protocol interface 124. An exemplary the FB-DIMM memory module connector as the serial protocol interface 124 comprises slots and/or holes that receive, engage, mesh, couple, connect, and/or mate with pins as an exemplary interface 108. The riser card 102 in an example fits directly into the FB-DIMM connector as the serial protocol interface 124. An edge of the riser card 102 in an example comprises gold fingers and/or pins that allow the riser card 102 to plug directly into the FB-DIMM memory module connector as the serial protocol interface 124. As discussed herein with reference to FIG. 2, the riser card 102 in an example comprises notches 206, 208 at both ends to allow the riser card 102 to be accommodated by end latches 410 (FIG. 4), for example, of a standard FB-DIMM memory module connector as an exemplary interface 124.

The bus 106 as an FB-DIMM bus in an example comprises a northbound (NB) path 140 and a southbound (SB) path 142. An exemplary northbound path 140 comprises fourteen (14) bit lanes carrying data from memory such as the parallel protocol memory module 112, 114 to a processor such as the host controller 126. An exemplary southbound path 142 comprises ten (10) southbound (SB) bit lanes carrying commands and data from the processor such as the host controller 126 to memory such as the parallel protocol memory module 112, 114. An exemplary parallel protocol bus 116, 118 comprises a Double Data Rate (DDR) bus, for example, a DDR3 bus.

To allow employment of one or more DDR3 DIMMs as one or more parallel protocol memory modules 112, 114 on a computer system and/or PCB 104 with an existing FB-DIMM connector as the serial protocol interface 124 in an example a user need only plug in riser card 102 into the FB-DIMM connector as the serial protocol interface 124 and install DDR3 SDRAM (Synchronous Dynamic Random Access Memory) DIMMs as the parallel protocol memory modules 112, 114 at interface 132, 134 on the riser card 102. For example, to allow employment of one or more DDR3 DIMMs as one or more parallel protocol memory modules 112, 114 in an example a user need only replace an FB-DIMM as the serial protocol memory module 128 with the riser card 102, and have the DDR3 SDRAM DIMMs as the parallel protocol memory modules 112, 114 coupled with the riser card 102. To allow employment of an FB-DIMM as the serial protocol memory module 128 in an example a user need only replace the riser card 102 with the FB-DIMM as the serial protocol memory module 128.

The FB-DIMM to DDR3 translator IC as the translator 110 in an example receives commands and read data from the host controller 126 and sends write data back to the host controller 126 using the FB-DIMM protocol as a serial memory protocol. The FB-DIMM to DDR3 translator IC as the translator 110 in an example translates the FB-DIMM protocol as the serial memory protocol to DDR protocol as a parallel memory protocol to send transfer commands and read/write data to the DDR3 DIMMs as the parallel protocol memory modules 112, 114. The translator 110 in an example drives one or more DDR busses as the busses 116, 118.

Figure 2:
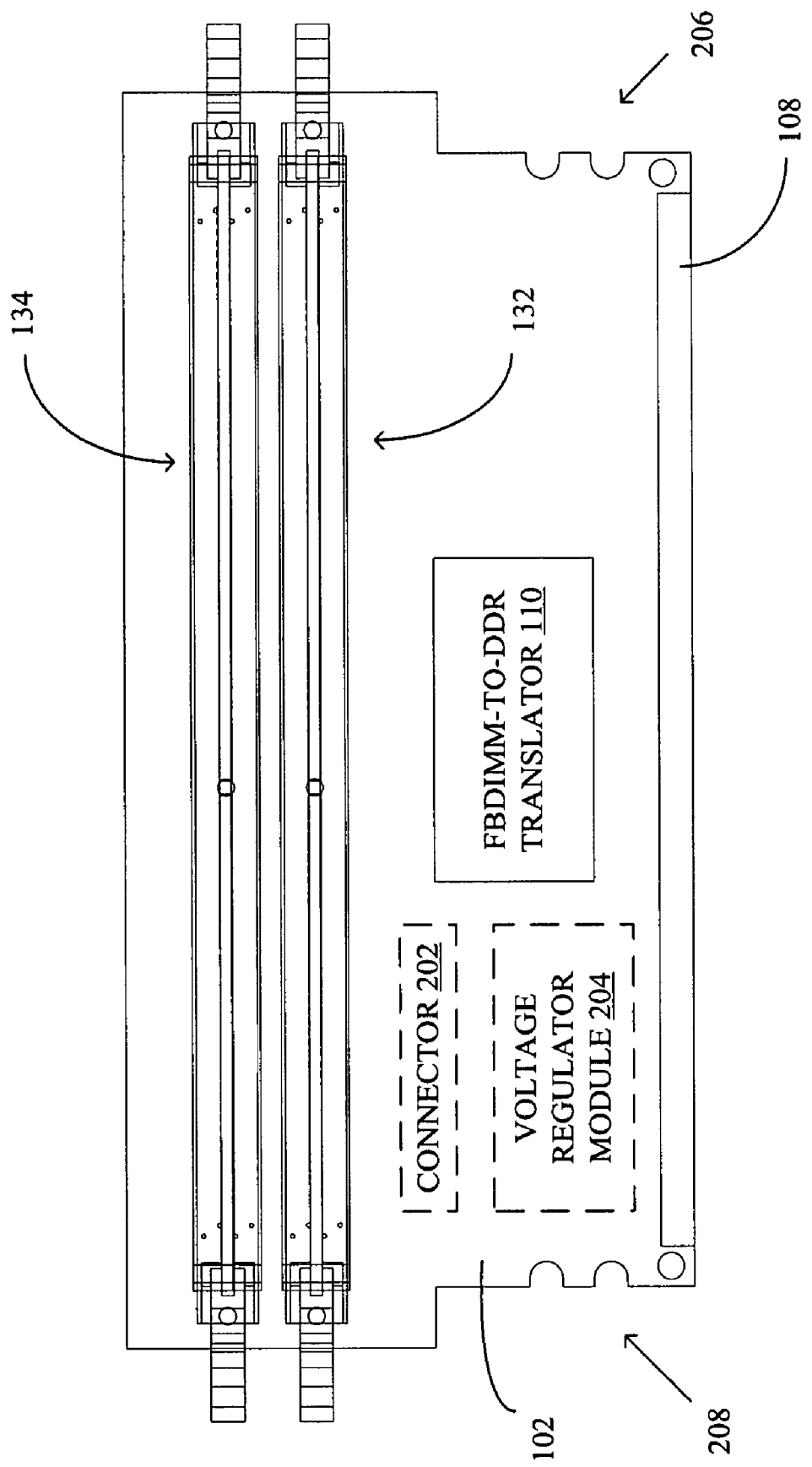
FIG. 2 is an enlarged, side representation of a riser card of an implementation of the apparatus of FIG. 1.

Turning to FIG. 2, the riser card 102 in an example comprises notches 206, 208 at both ends to allow the riser card 102 to be accommodated by end latches (not shown) of a standard FB-DIMM memory module connector as an exemplary interface 124. The riser card 102 in an example optionally comprises a connector 202 and/or one or more voltage regulator modules 204. The connector 202 in an example receives and/or couples with a flying lead cable (not shown) to deliver additional power to the riser card 102, for example, to the voltage regulator module 204. An exemplary connector 202 is locatable at any desirable, selected, and/or convenient place on the riser card 102. The voltage regulator module 204 in an example is locatable on the card 102 such as to provide additional, extra, and/or sufficient power to the components onboard and/or connected with the riser card 102. An exemplary voltage regulator module 204 serves to generate component and/or bus voltages.

Figure 3:
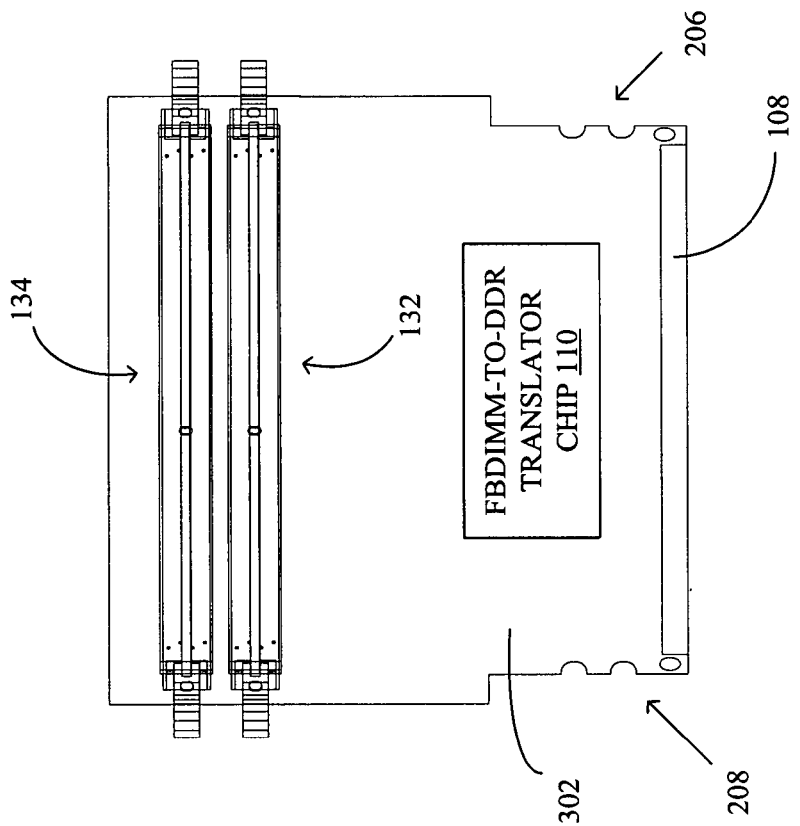
FIG. 3 is similar to FIG. 2 and represents an exemplary set and/or pair of riser cards of an implementation of the apparatus of FIG. 1.
Figure 3:
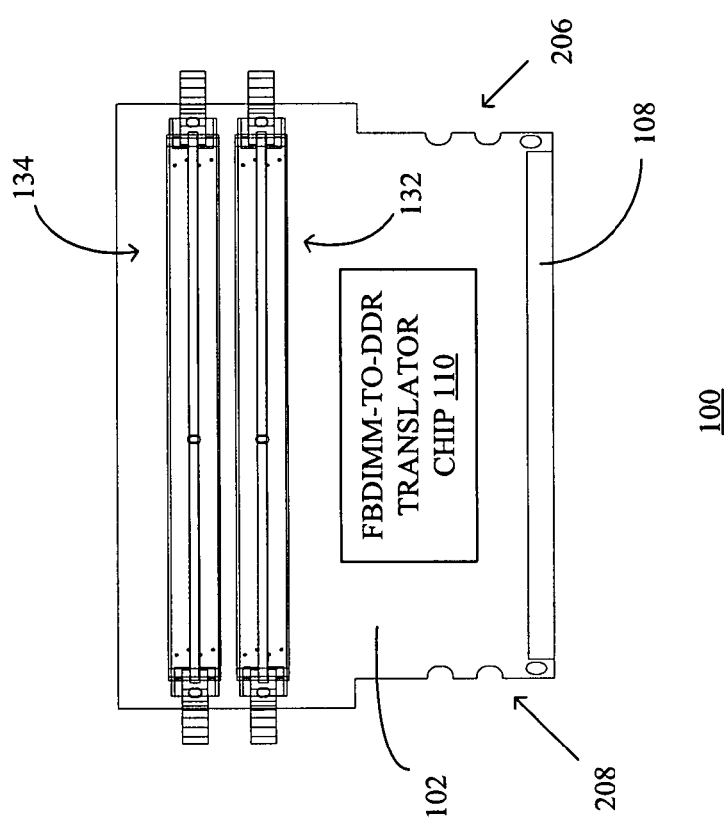

Turning to FIG. 3, the parallel protocol interfaces 132, 134 of the riser card 102 in an example are located at a different set of heights than the parallel protocol interfaces 132, 134 of the riser card 302. Referring to FIGS. 3 and 4, parallel protocol memory modules 112, 114 in an example comprise respective parallel protocol interfaces 136, 138 that mate and/or connect with the parallel protocol interfaces 132, 134 of the riser card 102 at a first set of heights. The parallel protocol memory modules 402, 404 in an example comprise respective parallel protocol interfaces 136, 138 that mate and/or connect with the parallel protocol interfaces 132, 134 of the riser card 302 at a second set of heights.

The riser cards 102, 302 in an example comprise a pair and/or set of riser cards, for example, that point inward and/or toward each other with the parallel protocol memory modules 112, 114 and the parallel protocol memory modules 402, 404 overlapping in a transverse and/or lateral direction relative to the PCB 104 without clashing, colliding, and/or abutting. Overlapping of DDR3 SDRAM DIMMs as a set of the parallel protocol memory modules 112, 114 and a set of the parallel protocol memory modules 402, 404 in an example serves to increase and/or promote available space for DIMMs insertion on the PCB 104 and the riser cards 102, 302, for example, allowing for standard pitch FB-DIMM connectors as the serial protocol interfaces 108, 124.

The different heights of the parallel protocol interfaces 132, 134 of the riser cards 102, 302 in an example allow employment of standard, reduced, and/or close pitch FB-DIMM connectors as the serial protocol interfaces 108 of the riser cards 102, 302 and the serial protocol interfaces 124 of the PCB 104. An exemplary standard pitch FB-DIMM connectors comprises a pitch of 0.5 in (12.7 mm) or wider. The different heights of the parallel protocol interfaces 132, 134 of the riser cards 102, 302 in an example allow employment of DDR3 SDRAM DIMMs as the parallel protocol memory modules 112, 114, 402, 404 supported on the riser cards 102, 302 and coupled with FB-DIMM connectors as the serial protocol interfaces 124 of the PCB 104. The different heights of the parallel protocol interfaces 132, 134 of the riser cards 102, 302 in an example allow the PCB 104 and the riser cards 102, 302 or the serial protocol memory module 128 as a computer memory subsystem to operate at full bandwidth and speed on of the DDR3 SDRAM DIMM memory architecture or the FB-DIMM memory architecture.

The serial protocol interfaces 108 of a plurality of riser cards 102, 302 in an example are inserted directly into a respective plurality of FB-DIMM connectors as the serial protocol interfaces 124 on the PCB 104. Referring to FIGS. 1, 4, and 5, DDR3 SDRAM memory as parallel protocol memory modules 112, 114, 402, 404 in an example have respective interfaces 136, 138 inserted on respective DDR3 DIMM connectors as the parallel protocol interfaces 132, 134 of the riser card 102. The PCB 102 in an example is embedded with FB-DIMM memory technology as a serial memory protocol implementation such as through employment of the host controller 126 and the serial protocol interfaces 124. An exemplary connector-to-connector distance 406 between adjacent and/or successive interfaces 124 comprises approximately 0.5 in (12.7 mm) or less, for example, to conform to a standard connector pitch. Another exemplary connector-to-connector distance 406 between adjacent and/or successive interfaces 124 comprises approximately 0.5 in (12.7 mm) or more. An exemplary distance 408 between first and fourth, skipping two in between, serial protocol interfaces 124 comprises approximately 1.5 in (38.1 mm). Referring to FIG. 5, the distance 408 in an example comprises an exemplary total depth of a pair of adjacent riser cards 102, 302 with the parallel protocol memory modules 112, 114, 402, 404 that comprises approximately 1.5 in (38.1 mm).

Figure 7:
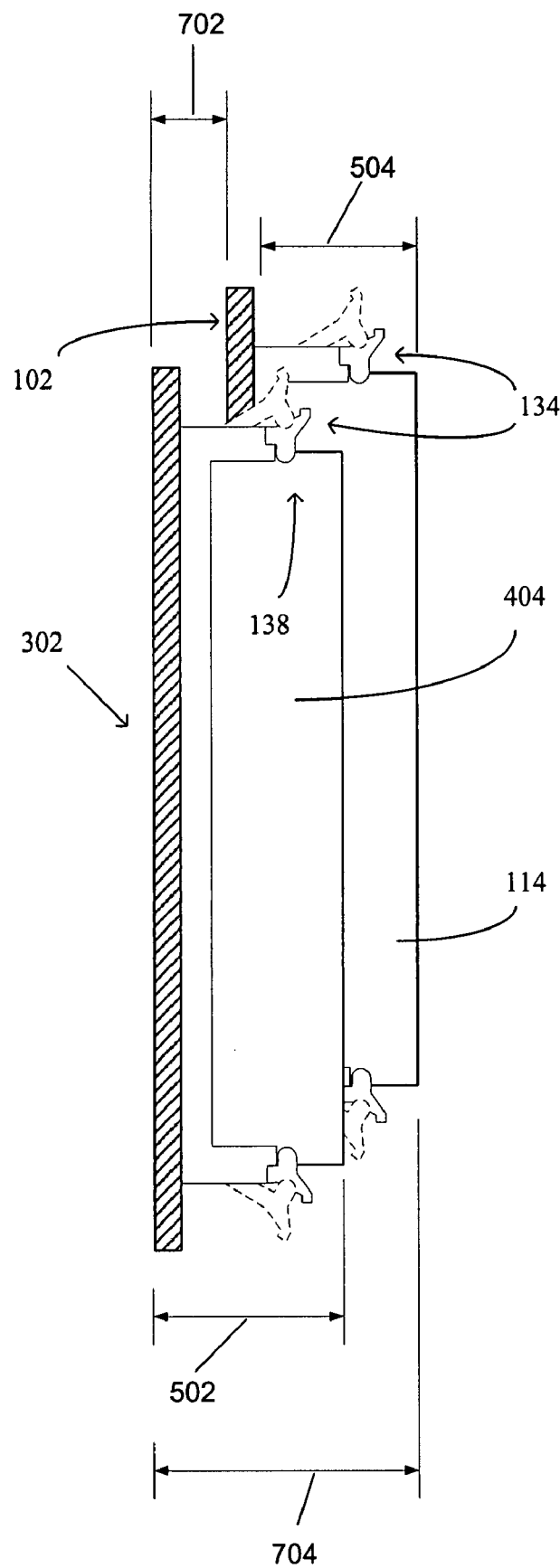
FIG. 7 is a top, partial, perspective representation of two riser cards and two parallel protocol memory modules of the implementation of the apparatus of FIG. 6.
Figure 8:
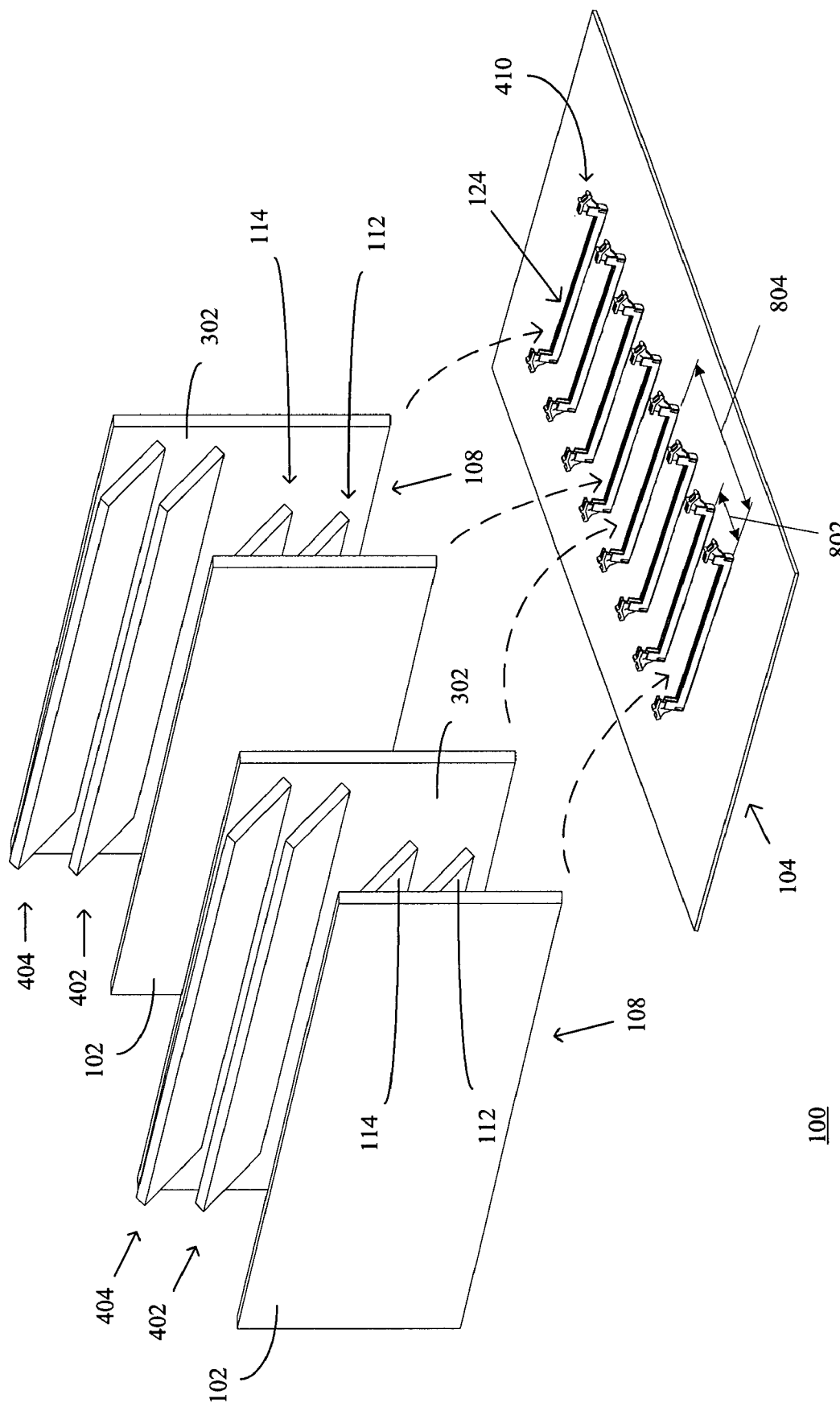
FIG. 8 is similar to FIGS. 4 and 6 and illustrates a third exemplary arrangement of the riser cards and parallel protocol memory modules.

Referring to FIG. 5, an exemplary interface 132 comprises a latch that pivots into a holding gap as an exemplary interface 136. An exemplary latch as the interface 132 comprises a standard DIMM connector and/or socket latch. An exemplary depth 502 of the riser card 102, 302 comprises approximately 1.4 in (35.56 mm). An exemplary depth 504 of the parallel protocol memory module 112, 114, 402, 404 comprises approximately 1.2 in (30.48 mm). Referring to FIG. 7, an exemplary spacing, separation, and/or distance 702 between the riser cards 102, 302 comprises approximately 0.3 in (7.62 mm). An exemplary total depth 704 of a pair of adjacent riser cards 102, 302 with the parallel protocol memory modules 112, 114, 402, 404 comprises approximately 1.7 in (43.18 mm).

Figure 9:
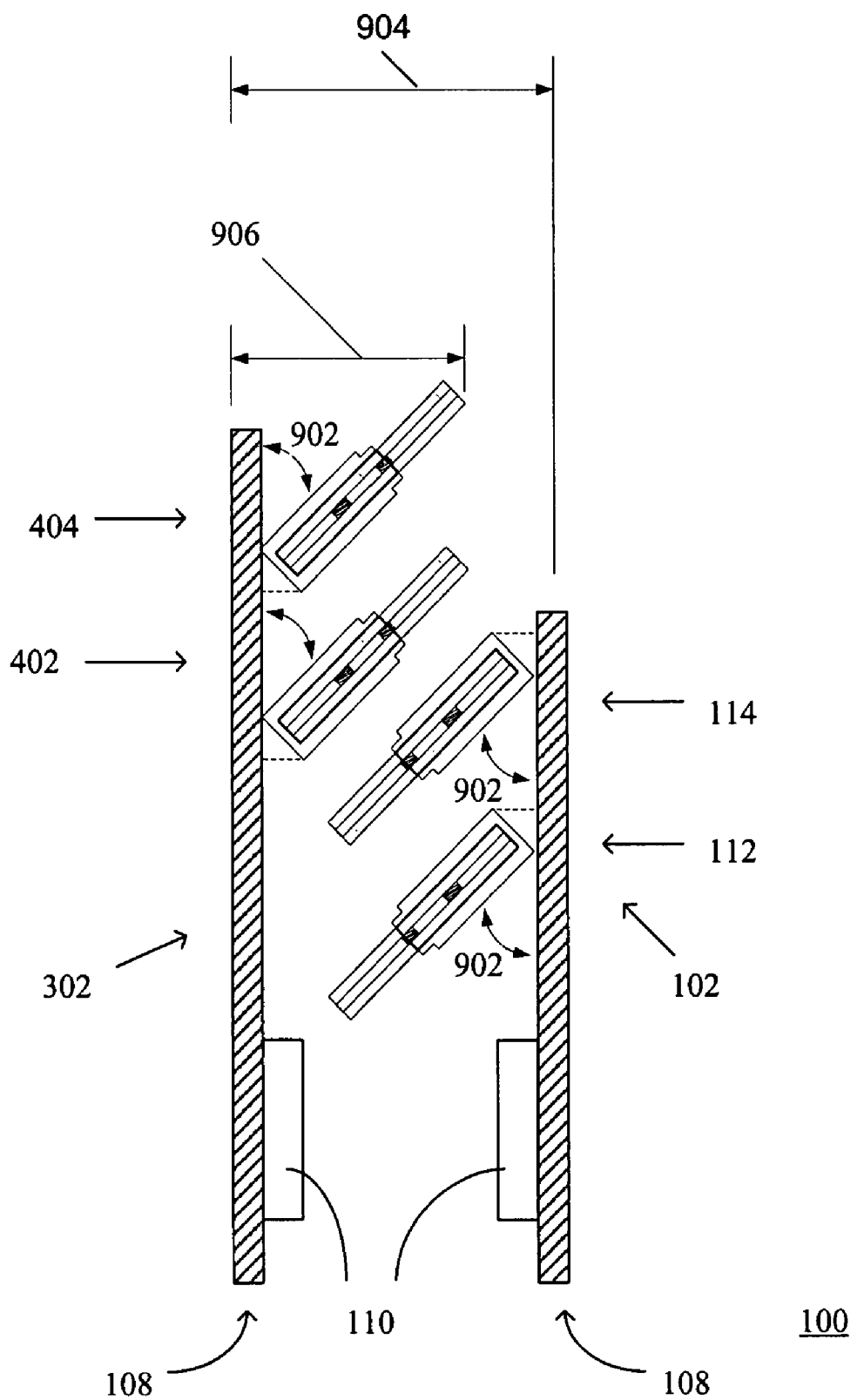
FIG. 9 is a side, partial representation of two riser cards and four parallel protocol memory modules of the implementation of the apparatus of FIG. 8, and illustrates an exemplary translator of the riser cards.
Figure 10:
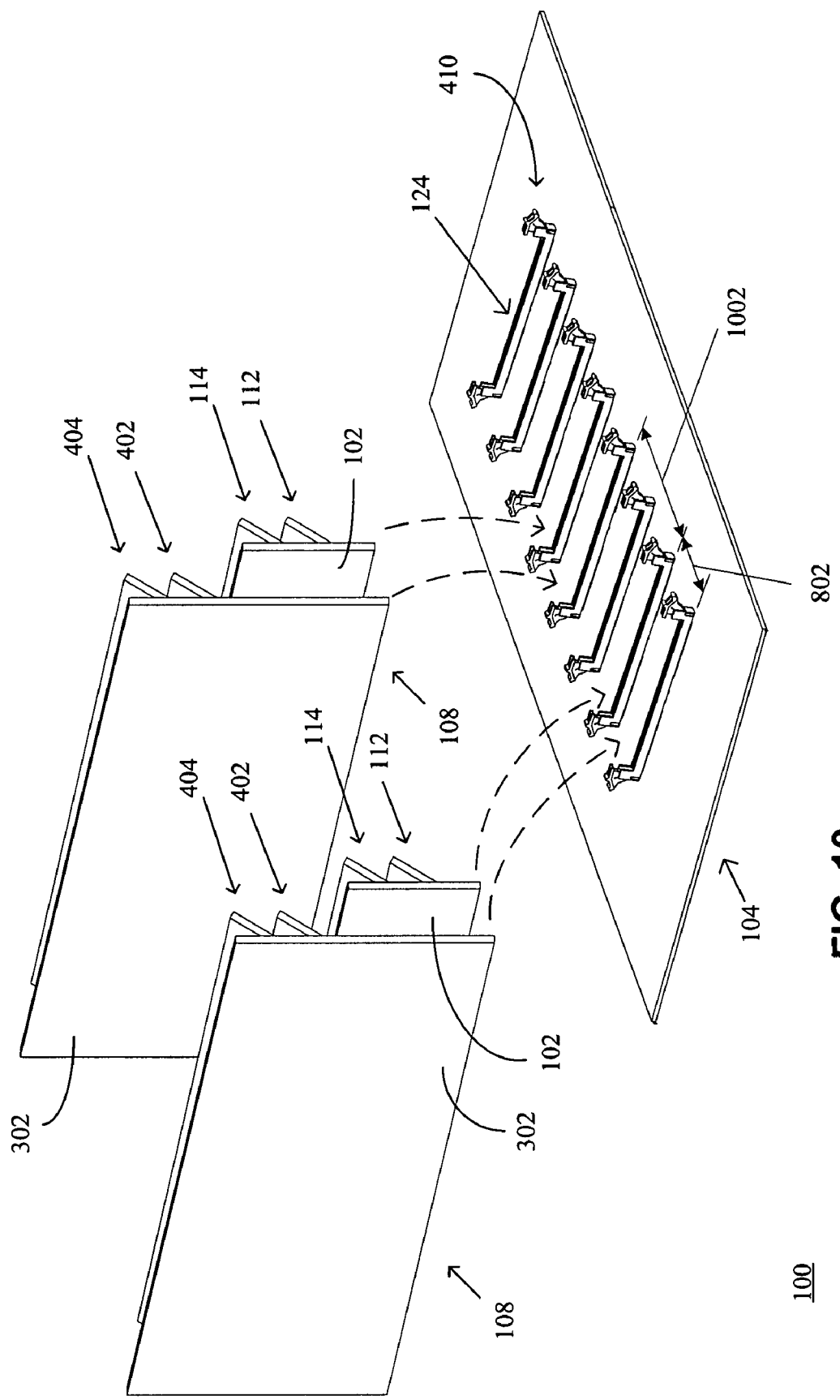
FIG. 10 is similar to FIGS. 4, 6, and 8 and illustrates a fourth exemplary arrangement of the riser cards and parallel protocol memory modules.
Figure 11:
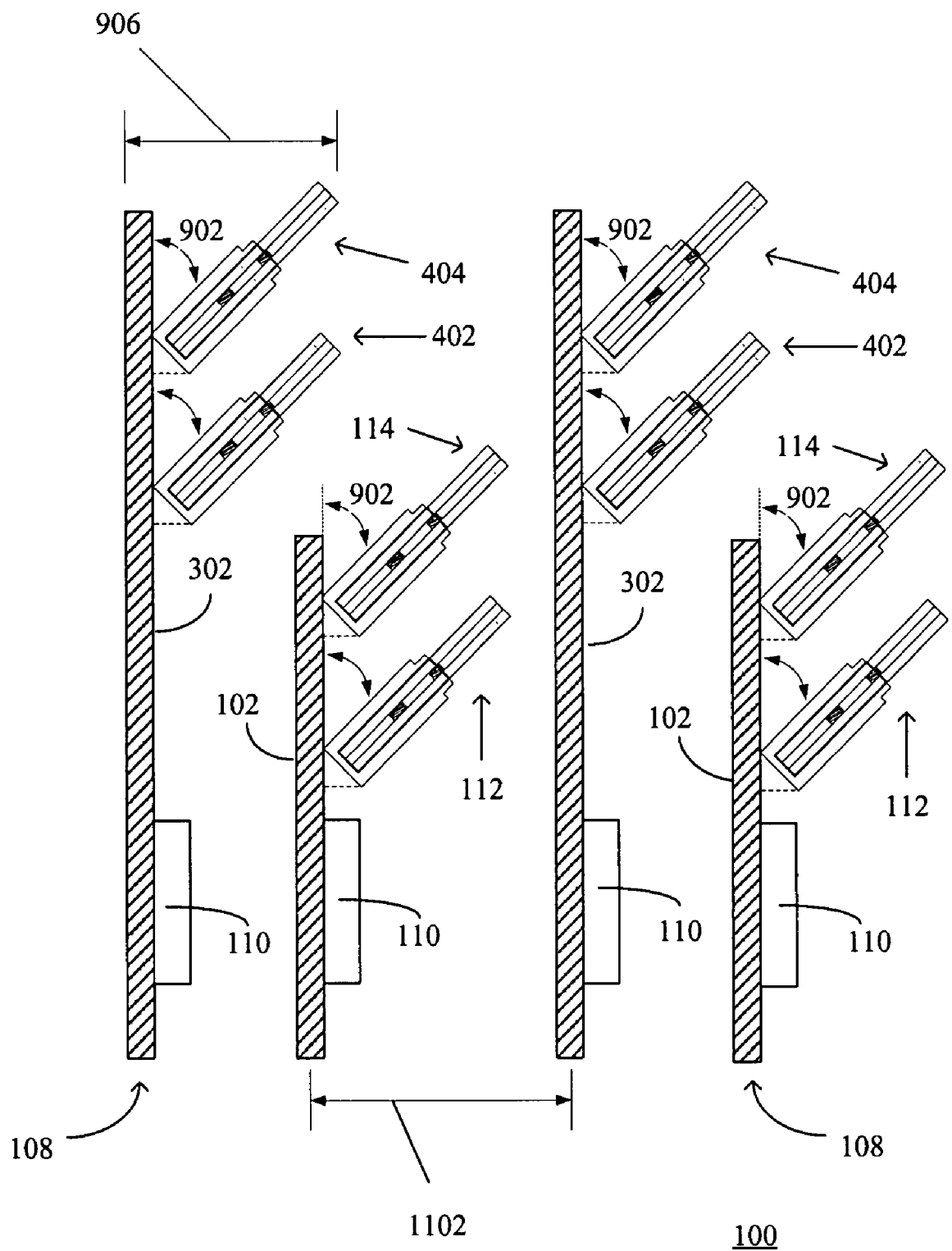
FIG. 11 is a side, partial representation of four riser cards and eight parallel protocol memory modules of the implementation of the apparatus of FIG. 10, and illustrates an exemplary translator of the riser cards.

Referring to FIGS. 1-7, exemplary interfaces 132, 134, 136, 138 are vertical and/or orthogonal. An exemplary DDR-DIMM interface as the interface 132, 134, 136, 138 in an example comprises connection of two hundred forty (240) pins and/or fingers that comply with standards of the JEDEC Solid State Technology Association (previously known as the Joint Electron Device Engineering Council; World Wide Web jedec.org). Referring to FIGS. 1-3 and 8-11, further exemplary interfaces 132, 134, 136, 138 are angled and/or oblique. An exemplary angle 902 comprises approximately twenty (20) to thirty (30) degrees, for example, twenty-five (25) degrees, relative to a supporting face of the riser card 102, 302. An exemplary connector-to-connector distance 802 between adjacent and/or successive interfaces 124 comprises approximately 0.45 in (11.43 mm) or less, for example, to conform to a standard and/or reduced connector pitch. An exemplary distance 804 between first and fourth, skipping two in between, serial protocol interfaces 124 comprises approximately 1.35 in (34.29 mm). Referring to FIG. 9, an exemplary total depth 904 of a pair of adjacent riser cards 102, 302 with the parallel protocol memory modules 112, 114, 402, 404 comprises approximately 0.9 in (22.86 mm). An exemplary depth 906 of the riser card 102, 302 comprises approximately 0.8 in (20.32 mm). Referring to FIG. 10, an exemplary distance 1002 between second and fourth, skipping one in between, serial protocol interfaces 124 comprises approximately 1 in (25.4 mm), for example, to conform to a standard connector pitch. Referring to FIG. 11, an exemplary distance 1102 between second and fourth, skipping one in between, serial protocol interfaces 124 comprises approximately 0.9 in (22.86 mm).

Figure 12:
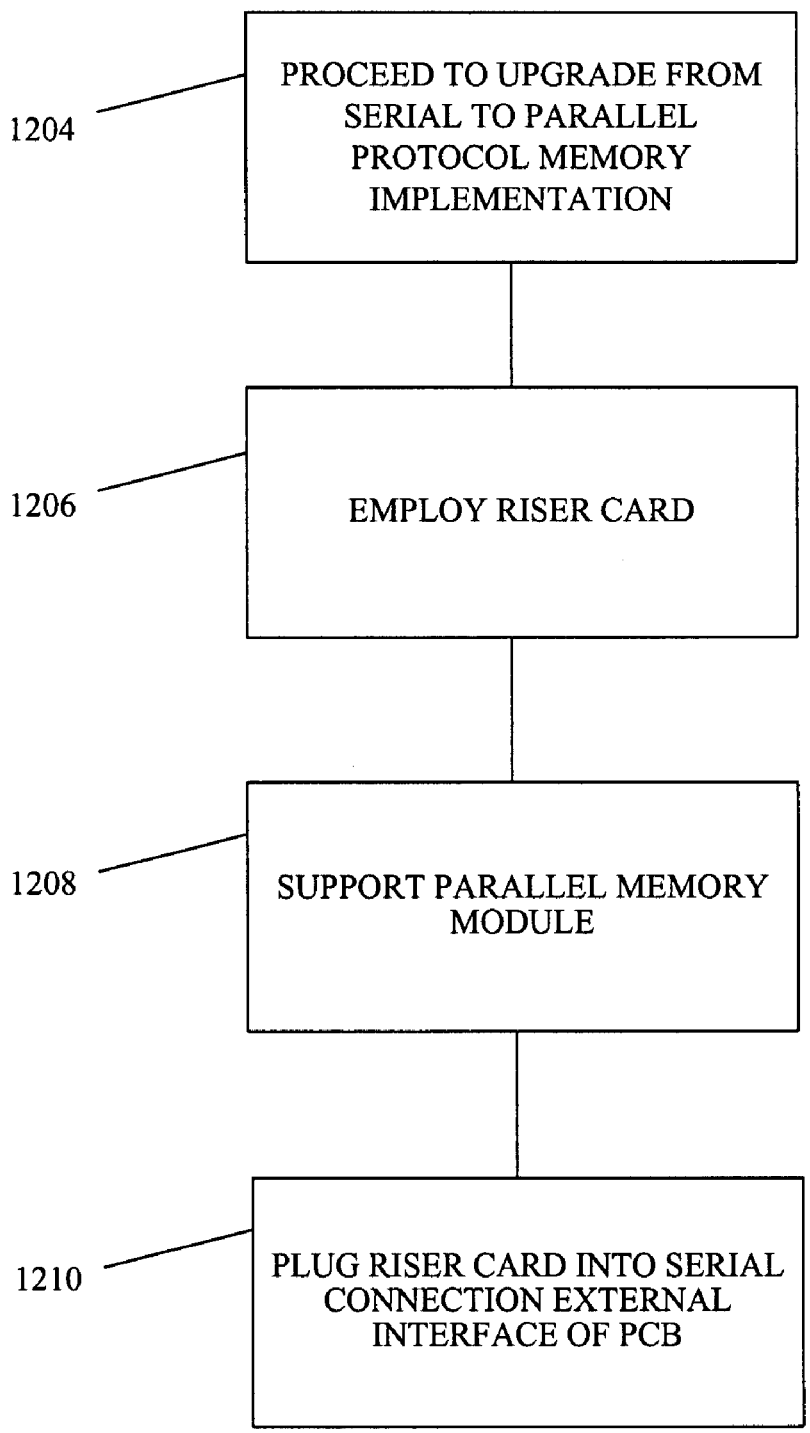
FIG. 12 is a representation of an exemplary logic flow for upgrade of a serial protocol memory implementation to a parallel protocol memory implementation of the apparatus of FIG. 1.

An illustrative description of an exemplary operation of an implementation of the apparatus 100 is presented, for explanatory purposes. FIG. 12 is a representation of an exemplary logic flow 1202 for upgrade of a serial protocol memory implementation 106, 126 to a parallel protocol memory implementation 110, 116, 118. The logic flow 1202 in an example is performed by a user, a consumer, an on-site service technician and/or provider, and/or an in-shop service technician and/or provider. STEP 1204 in an example proceeds to perform an upgrade a serial protocol memory implementation 106, 126 within a printed circuit board (PCB) 104 to a parallel protocol memory implementation 110, 116, 118 outside the PCB 104. STEP 1206 employs a first riser card 102. STEP 1208 supports a first memory module 112, 114 with the first riser card 102. The first memory module 112, 114 employs the parallel memory implementation 110, 116, 118. STEP 1210 plugs the first riser card 102 into a first serial connection external interface 124 of the PCB 104.

An exemplary implementation comprises a first riser card 102 that substantially axially connects with a first serial connection external interface 124 of a printed circuit board (PCB) 104 and at least in part laterally connects with a parallel connection external interface 136, 138 of a first memory module 112, 114. The first riser card 102 supports the first memory module 112, 114 with avoidance of abutment of the first memory module 112, 114 with a second memory module 402, 404 supported by a second riser card 302 that is adjacent to the first riser card 102.

The second riser card 302 substantially axially connects with a second serial connection external interface 124 of the PCB 104 and electrically and at least in part laterally connects with a parallel connection external interface 136, 138 of the second memory module 402, 404. The second riser card 302 supports the second memory module 402, 404 with avoidance of abutment of the second memory module 402, 404 with the first memory module 112, 114.

The first riser card 102 comprises a first parallel protocol interface 132, 134 that connects with the parallel connection external interface 136, 138 of the first memory module 112, 114 at a first height relative to the PCB 104. The second riser card 302 comprises a second parallel protocol interface 132, 134 that connects with the parallel connection external interface 136, 138 of the second memory module 402, 404 at a second height relative to the PCB 104. The first and second parallel protocol interfaces 132, 134 face toward each other and the first and second parallel protocol memory modules 112, 114, 402, 404 overlap from a perspective from the PCB 104 without abutment of the first and second parallel protocol memory modules 112, 114, 402, 404. The first and second parallel protocol interfaces 132, 134 face in a substantially same direction and the first and second parallel protocol memory modules 112, 114, 402, 404 overlap from a perspective from the PCB 104 without abutment of the first and second parallel protocol memory modules 112, 114, 402, 404.

The first and second parallel protocol memory modules 112, 114, 402, 404 are angled between twenty and thirty degrees relative to the respective first and second riser cards 102, 302. The first and second parallel protocol memory modules 112, 114, 402, 404 overlap from a perspective from the PCB 104 without abutment of the first and second parallel protocol memory modules 112, 114, 402, 404.

The first and second serial connection external interfaces 124 of the PCB 104 are separated by 0.5 in (12.7 mm) or less. The first and second serial connection external interfaces 124 of the PCB 104 are separated by 0.5 in (12.7 mm) or more.

The first riser card 102 communicates between the first serial connection external interface 124 of the PCB 104 and the parallel connection external interface 136, 138 of the first memory module 112, 114. The first riser card 102 comprises a translator 110 that through the serial connection external interface 124 of the PCB 104 and the parallel connection external interface 136, 138 of the first memory module 112,

114 communicates between a serial memory protocol within the PCB 104 and a parallel memory protocol within the first memory module 112, 114.

The first riser card 102 comprises a translator 110 that through the serial connection external interface 124 of the PCB 104 and the parallel connection external interface 136, 138 of the first memory module 112, 114 communicates between a fully buffered dual in-line memory module (FB-DIMM) protocol within the PCB 104 and a double data rate synchronous dynamic random access memory (DDR SDRAM) protocol within the first memory module 112, 114. The DDR SDRAM protocol comprises a DDR3 SDRAM protocol. The translator 110 through the serial connection external interface 124 of the PCB 104 and the parallel connection external interface 136, 138 of the first memory module 112, 114 communicates between the FB-DIMM protocol within the PCB 104 and the DDR3 SDRAM protocol within the first memory module 112, 114.

The first riser card 102 comprises a translator 110 that through the serial connection external interface 124 of the PCB 104 and the parallel connection external interface 136, 138 of the first memory module 112, 114 communicates between an FB DIMM protocol within the PCB 104 and the parallel memory protocol within the first memory module 112, 114. The first riser card 102 comprises a translator 110 that through the serial connection external interface 124 of the PCB 104 and the parallel connection external interface 136, 138 of the first memory module 112, 114 communicates between the serial memory protocol within the PCB 104 and a double data rate (DDR) memory protocol within the first memory module 112, 114. The DDR memory protocol comprises a DDR3 SDRAM protocol. The translator 110 through the serial connection external interface 124 of the PCB 104 and the parallel connection external interface 136, 138 of the first memory module 112, 114 communicates between the serial memory protocol within the PCB 104 and the DDR3 SDRAM protocol within the first memory module 112, 114.

An exemplary approach performs an upgrade of a serial memory implementation 106, 126 within a printed circuit board (PCB) 104 to a parallel memory implementation 110, 116, 118 outside the PCB 104 through employment of a first riser card 102 plugged into a first serial connection external interface 124 of the PCB 104. The first riser card 102 supports a first memory module 112, 114 that employs the parallel memory implementation 110, 116, 118.

The PCB 104 is provided to a user as a field deployment of the PCB 104 with a fixed distance between the first serial connection external interface 124 of the PCB 104 and a second serial connection external interface 124 of the PCB 104. The first riser card 102 is plugged into the first serial connection external interface 124 of the PCB 104 after the field deployment of the PCB 104 to the user.

The first riser card 102 is plugged into the first serial connection external interface 124 with avoidance of abutment of the first memory module 112, 114 with a second memory module 402, 404 supported by an adjacent riser card.

An exemplary implementation comprises a first riser card 102 that substantially axially connects with a first FB-DIMM connector of a plural number of FB-DIMM connectors on a PCB 104. The first riser card 102 comprises a first DDR-DIMM connector that engages a parallel connection external interface 136, 138 of a first memory module 112, 114. A second riser is adjacent to the first riser card 102. The second riser card 302 comprises a second DDR-DIMM connector that engages a parallel connection external interface 136, 138 of a second memory module 402, 404. The first and second riser cards 102, 302 support the first and second memory modules 402, 404 with avoidance of abutment of the first memory module 112, 114 with the second memory module 402, 404. The first and second riser cards 102, 302 comprise a plurality of DDR-DIMM connectors that is equal in number to the plural number of FB-DIMM connectors on the PCB 104. The plurality of DDR-DIMM connectors of the first and second riser cards 102, 302 comprises the first DDR-DIMM connector on the first riser card 102 and the second DDR-DIMM connector on the second riser card 302.

An implementation of the apparatus 100 in an example comprises a plurality of components such as one or more of electronic components, chemical components, organic components, mechanical components, hardware components, optical components, and/or computer software components. A number of such components can be combined or divided in an implementation of the apparatus 100. In one or more exemplary implementations, one or more features described herein in connection with one or more components and/or one or more parts thereof are applicable and/or extendible analogously to one or more other instances of the particular component and/or other components in the apparatus 100. In one or more exemplary implementations, one or more features described herein in connection with one or more components and/or one or more parts thereof may be omitted from or modified in one or more other instances of the particular component and/or other components in the apparatus 100. An exemplary technical effect is one or more exemplary and/or desirable functions, approaches, and/or procedures. An exemplary component of an implementation of the apparatus 100 employs and/or comprises a set and/or series of computer instructions written in or implemented with any of a number of programming languages, as will be appreciated by those skilled in the art. An implementation of the apparatus 100 in an example comprises any (e.g., horizontal, oblique, or vertical) orientation, with the description and figures herein illustrating an exemplary orientation of an exemplary implementation of the apparatus 100, for explanatory purposes.

An implementation of the apparatus 100 in an example encompasses an article. The article comprises one or more computer-readable signal-bearing media. The article comprises means in the one or more media for one or more exemplary and/or desirable functions, approaches, and/or procedures.

An implementation of the apparatus 100 in an example employs one or more computer readable signal bearing media. A computer-readable signal-bearing medium in an example stores software, firmware and/or assembly language for performing one or more portions of one or more implementations. An example of a computer-readable signal bearing medium for an implementation of the apparatus 100 comprises a memory and/or recordable data storage medium of the riser card 102, 302 and/or PCB 104. A computer-readable signal-bearing medium for an implementation of the apparatus 100 in an example comprises one or more of a magnetic, electrical, optical, biological, chemical, and/or atomic data storage medium. For example, an implementation of the computer-readable signal-bearing medium comprises one or more floppy disks, magnetic tapes, CDs, DVDs, hard disk drives, and/or electronic memory. In another example, an implementation of the computer-readable signal-bearing medium comprises a modulated carrier signal transmitted over a network comprising or coupled with an implementation of the apparatus 100, for instance, one or more of a telephone network, a local area network ("LAN"), a wide area network ("WAN"), the Internet, and/or a wireless network.

The steps or operations described herein are examples. There may be variations to these steps or operations without departing from the spirit of the invention. For example, the steps may be performed in a differing order, or steps may be added, deleted, or modified.

Although exemplary implementation of the invention has been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
    a first riser card that substantially axially connects with a first serial connection external interface of a printed circuit board (PCB) and at least in part laterally connects with a parallel connection external interface of a first memory module, wherein the first riser card is configured to accept more than one type of memory modules, wherein the first riser card supports the first memory module with avoidance of abutment of the first memory module with a second memory module supported by a second riser card that is adjacent to the first riser card;
    wherein the second riser card substantially axially connects with a second serial connection external interface of the PCB and electrically and at least in part laterally connects with a parallel connection external interface of the second memory module, wherein the second riser card supports the second memory module with avoidance of abutment of the second memory module with the first memory module; and
    wherein the first riser card comprises a translator integrated circuit (IC) that through the serial connection external interface of the PCB and the parallel connection external interface of the first memory module communicates between a serial memory protocol within the PCB and a parallel memory protocol within the first memory module.

2. The apparatus of claim 1, wherein the first riser card comprises a first parallel protocol interface that connects with the parallel connection external interface of the first memory module at a first height relative to the PCB, wherein the second riser card comprises a second parallel protocol interface that connects with the parallel connection external interface of the second memory module at a second height relative to the PCB.

3. The apparatus of claim 1, wherein the first and second serial connection external interfaces of the PCB are separated by less than 0.5 in (12.7 mm).

4. The apparatus of claim 1, wherein the first and second serial connection external interfaces of the PCB are separated by at least 0.5 in (12.7 mm).

5. The apparatus of claim 1, wherein the first riser card communicates between the first serial connection external interface of the PCB and the parallel connection external interface of the first memory module.

6. The apparatus of claim 1, wherein the first riser card comprises the translator IC that through the serial connection external interface of the PCB and the parallel connection external interface of the first memory module communicates between a fully buffered dual in-line memory module (FB-DIMM) protocol within the PCB and a double data rate synchronous dynamic random access memory (DDR SDRAM) protocol within the first memory module.

7. The apparatus of claim 1, wherein the first riser card comprises the translator IC that through the serial connection external interface of the PCB and the parallel connection external interface of the first memory module communicates between an FB-DIMM protocol within the PCB and the parallel memory protocol within the first memory module.

8. The apparatus of claim 1, wherein the first riser card comprises the translator IC that through the serial connection external interface of the PCB and the parallel connection external interface of the first memory module communicates between the serial memory protocol within the PCB and a double data rate (DDR) memory protocol within the first memory module.

9. The apparatus of claim 2, wherein the first and second parallel protocol interfaces face toward each other and the first and second parallel protocol memory modules overlap from a perspective from the PCB without abutment of the first and second parallel protocol memory modules.

10. The apparatus of claim 2, wherein the first and second parallel protocol interfaces face in a substantially same direction and the first and second parallel protocol memory modules overlap from a perspective from the PCB without abutment of the first and second parallel protocol memory modules.

11. The apparatus of claim 2, wherein the first and second parallel protocol memory modules are angled between twenty and thirty degrees relative to the respective first and second riser cards.

12. The apparatus of claim 6, wherein the DDR SDRAM protocol comprises a DDR3 SDRAM protocol, wherein the translator IC through the serial connection external interface of the PCB and the parallel connection external interface of the first memory module communicates between the FB-DIMM protocol within the PCB and the DDR3 SDRAM protocol within the first memory module.

13. The apparatus of claim 8, wherein the DDR memory protocol comprises a DDR3 SDRAM protocol, wherein the translator IC through the serial connection external interface of the PCB and the parallel connection external interface of the first memory module communicates between the serial memory protocol within the PCB and the DDR3 SDRAM protocol within the first memory module.

14. The apparatus of claim 11, wherein the first and second parallel protocol memory modules overlap from a perspective from the PCB without abutment of the first and second parallel protocol memory modules.

15. An apparatus, comprising:
    a first riser card that substantially axially connects with a first FB-DIMM connector of a plural number of FB-DIMM connectors on a PCB, wherein the first riser card comprises a first DDR-DIMM connector that engages a parallel connection external interface of a first memory module; and
    a second riser that is adjacent to the first riser card, wherein the second riser card comprises a second DDR-DIMM connector that engages a parallel connection external interface of a second memory module;
    wherein the first and second riser cards each comprise a translator IC configured to allow use of a DDR-DIMM memory module with a PCB that employs FB-DIMM connectors;
    wherein the first and second riser cards support the first and second memory modules with avoidance of abutment of the first memory module with the second memory module;
    wherein the first and second riser cards comprise a plurality of DDR-DIMM connectors that is equal in number to the plural number of FB-DIMM connectors on the PCB, wherein the plurality of DDR-DIMM connectors of the first and second riser cards comprises the first DDR-DIMM connector on the first riser card and the second DDR-DIMM connector on the second riser card.

* * * * *

UNITED STATES PATENT AND TRADEMARK OFFICE
CERTIFICATE OF CORRECTION

| | | |
|---|---|---|
| PATENT NO. | : 8,102,671 B2 | Page 1 of 1 |
| APPLICATION NO. | : 11/789632 | |
| DATED | : January 24, 2012 | |
| INVENTOR(S) | : Martin Goldstein et al. | |

It is certified that error appears in the above-identified patent and that said Letters Patent is hereby corrected as shown below:

In column 12, line 46, in Claim 15, after "second riser" insert -- card --.

Signed and Sealed this
Fourth Day of December, 2012

David J. Kappos
*Director of the United States Patent and Trademark Office*